US006991367B2

(12) United States Patent
Adlerstein

(10) Patent No.: US 6,991,367 B2
(45) Date of Patent: Jan. 31, 2006

(54) INTEGRATED THERMAL SENSOR FOR MICROWAVE TRANSISTORS

(75) Inventor: Michael G. Adlerstein, Wellesley, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/701,045

(22) Filed: Nov. 4, 2003

(65) Prior Publication Data

US 2005/0094708 A1 May 5, 2005

(51) Int. Cl.
*G01K 7/20* (2006.01)
(52) U.S. Cl. .................. 374/114; 374/185; 374/166; 374/152
(58) Field of Classification Search ............... 374/114, 374/112, 185, 183, 166, 163, 152, 141; 327/512, 327/513; 331/176, 177 V
See application file for complete search history.

(56) References Cited

U.S. PATENT DOCUMENTS

| 2,050,878 | A | * | 8/1936 | Dallmann et al. | .......... 374/114 |
| 2,432,199 | A | | 12/1947 | Kamm | |
| 3,091,965 | A | | 6/1963 | Strickland | |
| 3,517,555 | A | | 6/1970 | Strickland | |
| 3,531,990 | A | * | 10/1970 | Shinskey | .......... 374/114 |
| RE27,458 | E | * | 8/1972 | Simonyan et al. | .......... 374/114 |
| 3,908,164 | A | | 9/1975 | Parker | |
| 3,928,800 | A | | 12/1975 | Strenglein et al. | |
| 4,369,417 | A | * | 1/1983 | Kupfer | .......... 331/176 |
| 4,713,581 | A | | 12/1987 | Haimson | |
| 4,719,434 | A | * | 1/1988 | Scott et al. | .......... 333/32 |
| 4,793,182 | A | | 12/1988 | Djorup | |
| 4,924,195 | A | * | 5/1990 | Gonda | .......... 331/176 |
| 4,936,144 | A | | 6/1990 | Djorup | |
| 5,370,458 | A | * | 12/1994 | Goff | .......... 374/122 |
| 5,444,219 | A | * | 8/1995 | Kelly | .......... 219/505 |
| 5,563,760 | A | * | 10/1996 | Lowis et al. | .......... 361/103 |
| 5,681,989 | A | | 10/1997 | Kanke et al. | |
| 5,912,595 | A | * | 6/1999 | Ma et al. | .......... 331/176 |
| 5,994,970 | A | * | 11/1999 | Cole et al. | .......... 331/176 |

(Continued)

FOREIGN PATENT DOCUMENTS

EP  0 523 798 A1  1/1993

(Continued)

OTHER PUBLICATIONS

"Power Measurement Basics," Agilent Technologies (3 pages), prior to Nov. 4, 2003.

(Continued)

*Primary Examiner*—Diego Gutierrez
*Assistant Examiner*—Stanley J. Pruchnic, Jr.
(74) *Attorney, Agent, or Firm*—Daly, Crowley, Mofford & Durkee, LLP

(57) ABSTRACT

A circuit for determining temperature of an active semiconductor device disposed on a semiconductor substrate and a Wheatstone bridge circuit. The bridge has in each of four branches thereof a thermal sensitive device, one pair of such thermal sensitive devices being in thermal contact with an electrode of the active device. Another pair of such thermal sensitive devices is in thermal contact with the substrate. The thermal sensitive devices are resistors. The active device is a transistor. A tuning circuit is coupled to an output of the transistor, such tuning circuit having a tunable element controlled by a control signal fed to such tunable element. A processor is responsive to a voltage produced at an output of the Wheatstone bridge circuit and a signal representative of power fed to the transistor. The output provided by the Wheatstone bridge provides a measure of a temperature difference between the temperature of the transistor and ambient temperature.

5 Claims, 2 Drawing Sheets

U.S. PATENT DOCUMENTS

| | | | |
|---|---|---|---|
| 6,091,309 A * | 7/2000 | Burke et al. | 331/177 V |
| 6,198,296 B1 | 3/2001 | Invaov | |
| 6,362,699 B1 * | 3/2002 | Fry | 331/176 |
| 6,384,787 B1 | 5/2002 | Kim et al. | |
| 6,486,679 B1 | 11/2002 | Holt | |
| 6,603,367 B2 * | 8/2003 | Pao et al. | 331/177 V |
| 6,767,129 B2 * | 7/2004 | Lee et al. | 374/122 |
| 6,853,176 B2 | 2/2005 | Lymer | |
| 2001/0035758 A1 | 11/2001 | Furukawa | |
| 2004/0183519 A1 | 9/2004 | Lymer | |
| 2005/0093532 A1 * | 5/2005 | Adlerstein et al. | 324/76.14 |

FOREIGN PATENT DOCUMENTS

| | | |
|---|---|---|
| EP | 1 460 437 A1 | 9/2004 |
| JP | 56090264 A * | 7/1981 |

OTHER PUBLICATIONS

Coplanar Waveguides Supported by InGaP and GaAs/AlGaAs Membrane-Like Bridges, http:/www. elu.sav.sk/dept/oms/nato/md.html, May 8, 2003 (3 pages).

PCT/US2004/036264 International Search Report.

* cited by examiner

INTEGRATED THERMAL SENSOR FOR MICROWAVE TRANSISTORS

TECHNICAL FIELD

This invention relates to microwave transistors, and more particularly to circuitry for monitoring temperature of such transistors.

BACKGROUND

As is known in the art, it is desirable to monitor the temperature of microwave transistors relative to ambient temperature. By monitoring the temperature of such transistors in a monolithic integrated circuit it is possible to (1) insure that the transistor does not exceed a specified temperature over a wide range of operating temperatures; and (2) use the temperature to dynamically tune a circuit having the transistor.

SUMMARY

A circuit for determining temperature of an active semiconductor device disposed on a semiconductor substrate and a Wheatstone bridge circuit. The bridge has in each of four branches thereof a thermal sensitive device, one pair of such thermal sensitive devices being in thermal contact with an electrode of the active device. Another pair of such thermal sensitive devices is in thermal contact with the substrate. The thermal sensitive devices are resistors. The active device is a transistor. A tuning circuit is coupled to an output of the transistor, such tuning circuit having a tunable element controlled by a control signal fed to such tunable element. A processor is responsive to a voltage produced at an output of the bridge circuit and a signal representative of power fed to the transistor. The output provided by the Wheatstone bridge provides a measure of a temperature difference between the temperature of the transistor and ambient temperature. The processor produces the control signal to maximize power fed to the transistor and minimize power dissipated by such transistor.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
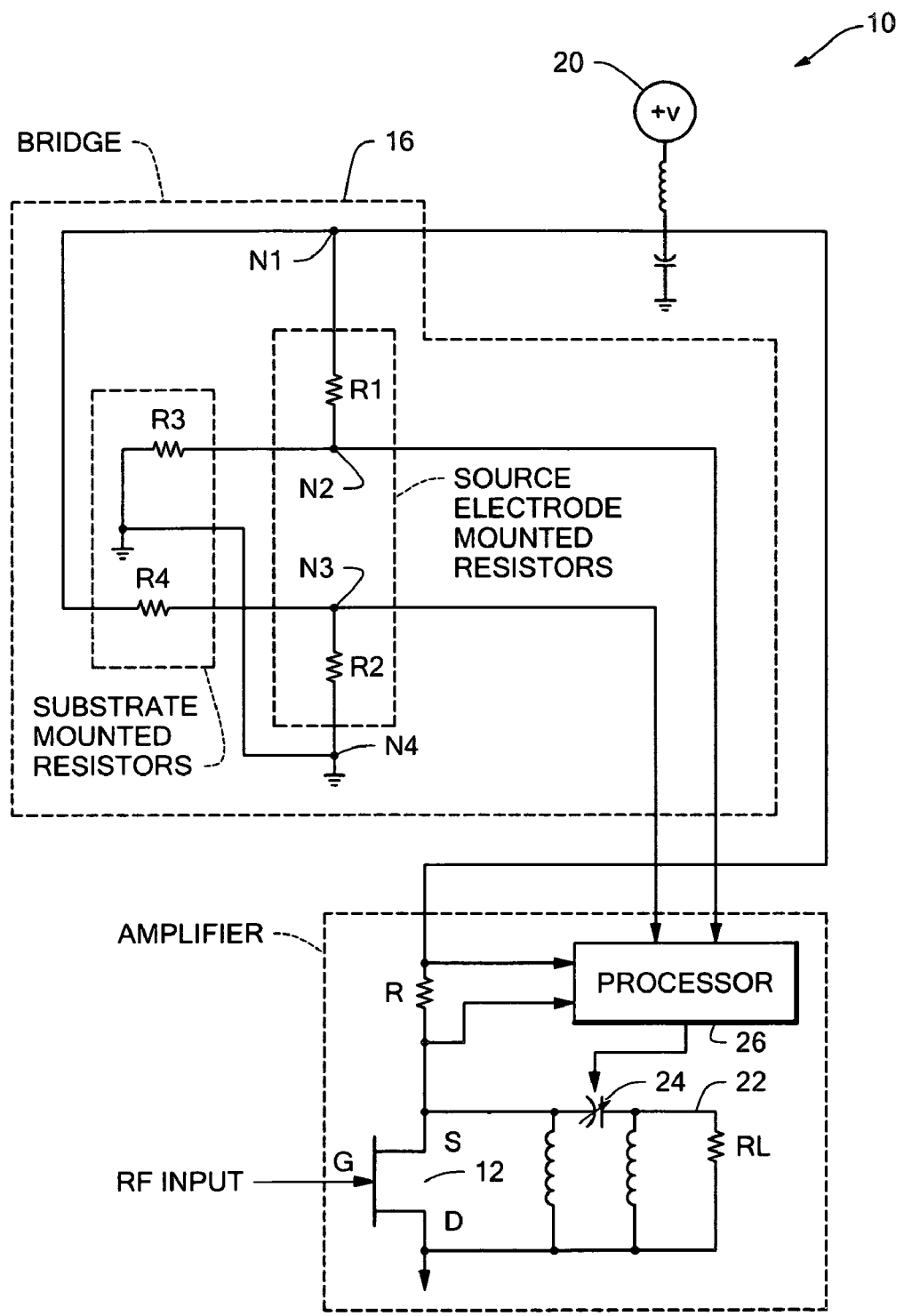
FIG. 1 is a schematic diagram of a circuit for determining the operating temperature of an active semiconductor device according to the invention.

Referring now to FIG. 1, a circuit 10 is shown for determining the operating temperature of an active semiconductor device, here a transistor 12. The circuit 10 is located on a semiconductor substrate 14 (FIGS. 2A, 2B and 2C) having thereon the active device 12. Here the transistor 12 is a field effect transistor having source electrode, S, drain electrode D and gate electrode G, as shown.

The circuit 10 includes a bridge circuit 16, here a Wheatstone bridge. The bridge 16 includes a first thermal sensitive device, here a resistor R1, disposed in thermal contact with an electrode, here the source electrode, S, of the active device 12. The first thermal sensitive device R1 has a pair of terminals, a first one of the pair of terminals being connected to a first node N1 and a second one of the pair of terminals being connected to a second node N2.

The bridge 16 includes a second thermal sensitive device, here a resistor R2, disposed in thermal contact with the source electrode, S, of the active device 12. The second thermal sensitive device R2 has a pair of terminals, a first one of the pair of terminals being connected to a third node N3 and a second one of the pair of terminals being connected to a fourth node N4, The bridge 16 includes a third thermal sensitive device, here a resistor R3, disposed in thermal contact with the substrate 14. The third thermal sensitive device R3 has a pair of terminals, a first one of the pair of terminals being connected to the second node N2 and a second one of the pair of terminals being connected to the fourth node N4.

The bridge 16 includes a fourth thermal sensitive device, here a resistor R4, disposed in thermal contact with the substrate 14. The fourth thermal sensitive device R4 has a pair of terminals, a first one of the pair of terminals being connected to the first node N1 and a second one of the pair of terminals being connected to the third node N3. A dc voltage potential 20 is connected between the first node N1 and the fourth node, N4, here such node N4 being at ground potential, as indicated. The second node N2 and the third node N3 provide an output of the bridge 16.

The circuit 10 includes a tuning circuit 22 coupled to an output electrode of the transistor 12. The tuning circuit 22 has a tunable element 24, here a varactor, controlled by a control signal fed to such tunable element 24 by a processor 26.

The output voltage between nodes N2 and N3 is proportional to the difference between the product of the resistance of resistor R3 and the resistance of resistor R4 and the product of the resistance of resistor R2 and the resistance of resistor R1. That is, the output voltage between nodes N2 and N3 is proportional to R3R4–R2R1. Resistors R3 and R4 are in thermal contact with the substrate 14 and are thus at a common temperature representative of the ambient temperature of the circuit 10. Resistors R1 and R2 are in thermal contact with the source electrode, S, of the transistor 12. Thus, if the temperature of the transistor 12 and the ambient temperature are the same, as when the transistor is not operating, the output voltage of the bridge is zero. It follows then that when the transistor operates, it will become hotter than the ambient temperature and the output voltage between nodes N2 and N3 will increase. Because the resistance of the resistors R1 and R2 increase with an increase in temperature, it follows then that the output voltage of the bridge 16, i.e., the voltage between nodes N2 and N3, provide a measure of the power being dissipated by the operating transistor 12.

The processor 26 is responsive to the voltage produced at the output of the bridge 16 and a signal representative of power fed to the transistor 12. Any one of a variety of means may measure the power fed to the transistor 12, here, for example, such power is measured by a voltage V produced across a precision resistor R in the source circuit of the transistor 12. The voltage across this resistor is IR while the bias power into the transistor is this current multiplied by the voltage drop across the transistor.

The processor is programmed to produce the control signal for the varactor which maximizes power fed to the transistor, as detected by the voltage produced across resistor R while minimizing power dissipated by such transistor, as detected by the output voltage across nodes N2 and N3 of bridge 16.

More particularly, the process of self-alignment and dynamic tuning can be understood based on the following balance equation:

$$P_{rf.load} + P_{rf.tuner} = P_{dc} - P_{diss} + P_{rf.in}$$

where $P_{rf.load}$ is the power to the load, here represented in FIG. 1 by resistor R1;

$P_{rf.tuner}$ is the power dissipated in the tuner 22;

$P_{dc}$ is the power fed to the transistor 12;

$P_{diss}$ is the power dissipated in the transistor as represented by the output voltage of the bridge 16 (i.e., the voltage between nodes N1 and N3); and $P_{rf.in}$ in the input radio frequency (rf)power fed to the gate G of transistor 12.

Here, the rf power output is divided into two parts; one is the part that flows into the load; and the other is the part that is dissipated in the tuner 22. The right side of the equation represents the remaining power of the device: the DC bias power (i.e., $P_{dc}$); the power dissipated as heat and is thus proportional to the temperature rise of the transistor 12; and the rf power input to the transistor 12. For simplicity, the following assumptions are made: (1) the rf power input to the transistor 12 is fixed; (2) the transistor input remains matched over a range of output tuner 22 operating range; and (3) the tuner 22 is lossless such that $P_{rf.tuner}$ is zero.

With such assumptions, with the circuit 10 (FIG. 1), the use of an rf detector on the output of the transistor is avoided by providing a sensor for $P_{dc}$ and $P_{diss}$. Here, the sensor for $P_{dc}$ is the resistor R and the sensor for $P_{diss}$ is the bridge 16. It is assumed that the DC voltage across the transistor is fixed.

Figure 2A:
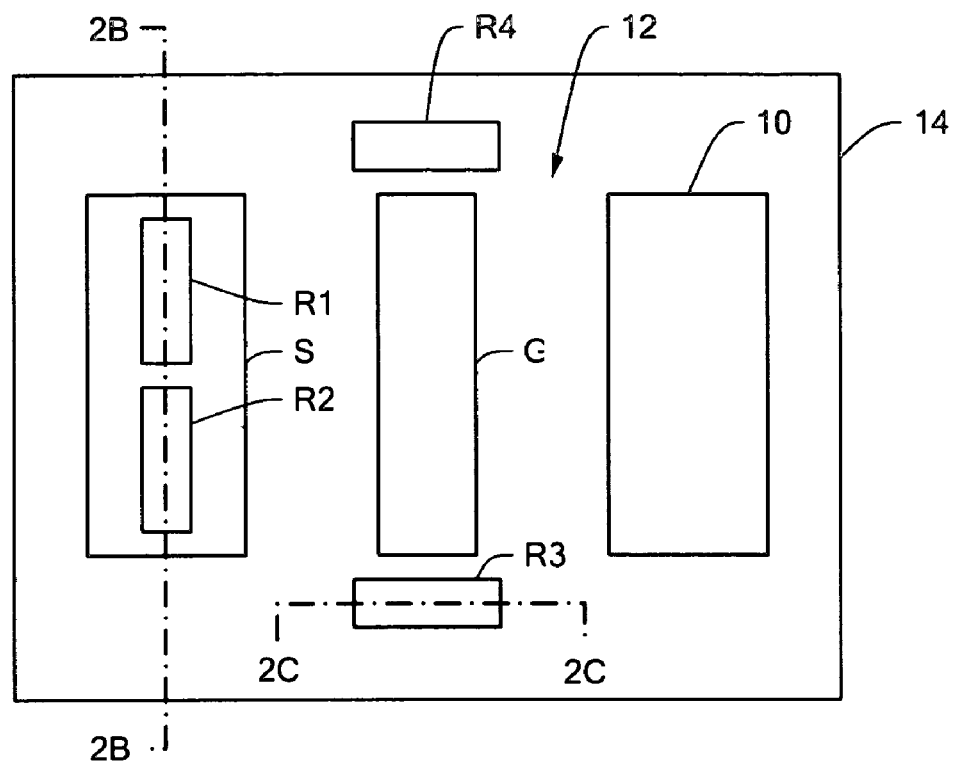
FIG. 2A is a plan view of a portion of a semiconductor substrate, such portion having a transistor used in the circuit of FIG. 1 thereon and having a four resistors used in the circuit of FIG. 1.
Figure 2B:
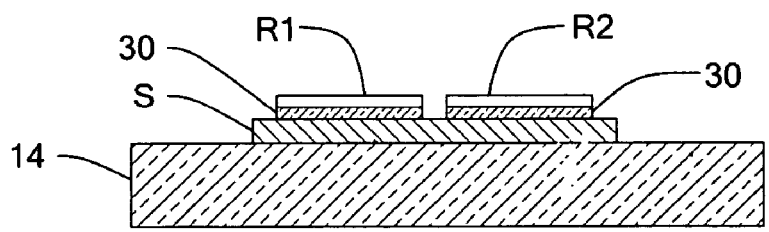
FIG. 2B is a cross sectional view of the portion of the substrate of FIG. 2A, such cross section being taken along line 2B—2B of FIG. 2A.
Figure 2C:
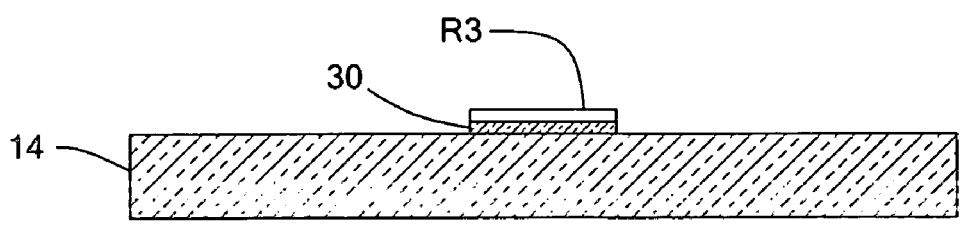
FIG. 2C is a cross sectional view of the portion of the substrate of FIG. 2A, such cross section being taken along line 2C—2C of FIG. 2A.

Referring now to FIGS. 2A–2C, the substrate 14, here for example silicon or gallium arsenide, has disposed on a source electrode S of the transistor 12 a thin insulating layer, 30, here for example silicon nitride. Disposed on the layer of silicon nitride are evaporated thin film resistors R1 and R2, here made of nichrome, for example. It is noted that when the layer 30 is formed on the source electrode S, a layer 30 of silicon nitride is also formed on portions of the substrate 12.

A number of embodiments of the invention have been described. Nevertheless, it will be understood that various modifications may be made without departing from the spirit and scope of the invention. Accordingly, other embodiments are within the scope of the following claims.

What is claimed is:

1. An amplifier circuit having a transistor for amplifying a radio frequency signal fed thereto, such amplified signal being coupled to a load, such amplifier comprising:

(A) a circuit for determining temperature of the transistor, comprising:

(a) a semiconductor substrate having thereon the transistor;

(b) a bridge circuit comprising:

(i) a first thermal sensitive device disposed in thermal contact with an electrode of the transistor, such first thermal sensitive device having a pair of terminals, a first one of the pair of terminals being connected to a first node and a second one of the pair of terminals being connected to a second node;

(ii) a second thermal sensitive device disposed in thermal contact with the electrode of the transistor, such second thermal sensitive device having a pair of terminals, a first one of the pair of terminals being connected to a third node and a second one of the pair of terminals being connected to a fourth node;

(iii) a third thermal sensitive device disposed in thermal contact with the substrate, such third thermal sensitive device having a pair of terminals, a first one of the pair of terminals being connected to the second node and a second one of the pair of terminals being connected to the fourth node;

(iv) a fourth thermal sensitive device disposed in thermal contact with the substrate, such fourth thermal sensitive device having a pair of terminals, a first one of the pair of terminals being connected to the first node and a second one of the pair of terminals being connected to the third node;

(v) a voltage source providing a voltage potential between the first node and the fourth node;

(vi) an output provided by the second node and the third node;

(B) a tuning circuit coupled between an output electrode of the transistor and the load, such tuning circuit having a tunable element controlled by a control signal fed to such tunable element;

(C) an electrical device coupled between the voltage source and the transistor for providing a measure of power fed to the transistor; and (D) a processor coupled to the electrical device and to output provided by the second node and the third node for producing the control signal.

2. The amplifier recited in claim 1 wherein the thermal sensitive devices are resistors.

3. The circuit recited in claim 1 wherein the output provides a measure of a temperature difference between the temperature of the transistor and ambient temperature.

4. The circuit recited in claim 1 wherein the processor produces the control signal to maximize power fed to the transistor and minimize power dissipated by such transistor.

5. The circuit recited in claim 1 wherein the electrical device is a resistor.

* * * * *

UNITED STATES PATENT AND TRADEMARK OFFICE
CERTIFICATE OF CORRECTION

PATENT NO. : 6,991,367 B2 Page 1 of 1
DATED : January 31, 2006
INVENTOR(S) : Adlerstein It is certified that error appears in the above-identified patent and that said Letters Patent is hereby corrected as shown below:

<u>Column 1,</u>
Line 16, delete "circuit it is" and replace with -- circuit, it is --.
Line 57, delete "having a four resistors" and replace with -- having four resistors --.

<u>Column 2,</u>
Line 8, delete "electrode, S," and replace with -- electrode S, --.

<u>Column 4,</u>
Lines 49-50, delete "to output" and replace with -- to the output --.

Signed and Sealed this

Thirtieth Day of May, 2006

JON W. DUDAS
*Director of the United States Patent and Trademark Office*